United States Patent
Gough

(10) Patent No.: US 6,654,256 B2
(45) Date of Patent: Nov. 25, 2003

(54) ELECTROMAGNETIC INTERFERENCE SHIELDS

(75) Inventor: Gerald Ronald Gough, Houghton Regis (GB)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/050,388

(22) Filed: Jan. 16, 2002

(65) Prior Publication Data

US 2002/0093806 A1 Jul. 18, 2002

(30) Foreign Application Priority Data

Jan. 17, 2001 (GB) .............................................. 0101212

(51) Int. Cl.[7] .............................................. H05K 9/00
(52) U.S. Cl. ...................... 361/816; 361/800; 361/818; 361/752; 361/801; 361/803; 174/35 R
(58) Field of Search ................................. 361/800, 816, 361/818, 752, 753, 796, 801, 803; 174/35 R

(56) References Cited

U.S. PATENT DOCUMENTS

| | | | |
|---|---|---|---|
| 5,162,980 A | * 11/1992 | Morgan et al. | 174/35 GC |
| 5,195,022 A | * 3/1993 | Hoppal et al. | 361/685 |
| 5,774,330 A | * 6/1998 | Melton et al. | 312/223.2 |
| 5,774,337 A | * 6/1998 | Lee et al. | 361/683 |
| 6,018,125 A | * 1/2000 | Collins et al. | 174/35 R |
| 6,088,231 A | 7/2000 | Fajardo | |
| 6,095,862 A | * 8/2000 | Doye et al. | 439/138 |
| 6,137,051 A | * 10/2000 | Bundza | 174/35 R |
| 6,157,540 A | * 12/2000 | Eddings et al. | 361/727 |
| 6,163,453 A | 12/2000 | Hou et al. | |
| 6,163,454 A | 12/2000 | Strickler | |
| 6,239,359 B1 | 5/2001 | Lilienthal, II et al. | |
| 6,252,160 B1 | * 6/2001 | Chang et al. | 174/35 GC |
| 6,252,313 B1 | 6/2001 | Zhang et al. | |
| 6,278,617 B1 | 8/2001 | Yang et al. | |
| 6,320,121 B1 | * 11/2001 | Honeycutt et al. | 174/35 R |
| 6,339,536 B1 | * 1/2002 | Buican et al. | 361/800 |
| 6,359,768 B1 | * 3/2002 | Eversley et al. | 361/212 |

FOREIGN PATENT DOCUMENTS

| | | |
|---|---|---|
| DE | 19821522 | 6/1999 |
| EP | 0 843 512 | 5/1998 |

OTHER PUBLICATIONS

UK Search Report Application No. GB 0101212.9, mailed Jun. 6, 2002.
"Mechanical Enabling Efforts", Intel Developer Forum, Intel Corporation, Fall 2000.

\* cited by examiner

*Primary Examiner*—David Martin
*Assistant Examiner*—Thanh Yen Tran
(74) *Attorney, Agent, or Firm*—Meyertons Hood Kivlin Kowert & Goetzel, P.C.; B. Noë Kivlin

(57) ABSTRACT

An electromagnetic interference (EMI) shield fills an aperture in a wall of a system unit housing. The electromagnetic interference shield is integrally formed from sheet metal (e.g. stainless steel). It comprises a perforated substantially planar portion with fingers defined around the periphery thereof. A plurality of first fingers are preformed to define abutments to abut against an outer surface of the wall and a plurality of second fingers are preformed to define sprung latches for latching within the aperture. The combination of first and second fingers means that the EMI shield can be located in the aperture in a removable manner without the use of tools. The perforations are configured to permit ventilation of the interior system housing while preventing EMI interference radiating from the system housing. A handle portion is also formed at the periphery of the substantially planar portion for facilitating the insertion and removal of the shield.

19 Claims, 2 Drawing Sheets

ELECTROMAGNETIC INTERFERENCE SHIELDS

BACKGROUND OF THE INVENTION

This invention relates to electromagnetic interference (EMI) shields.

Modern computer equipment is required to provide EMI shielding for openings in the equipment housing in order to meet EMI emissions standards. However, the shielding of such apertures can conflict with the need to provide adequate ventilation for the equipment.

Where the EMI shielding is used to fill an opening for the insertion of a removable component, for example a removable media drive, there is a need to make the EMI shielding readily removable, preferably without the need for tools.

The present invention seeks to provide electromagnetic shielding that addresses these conflicting requirements.

SUMMARY OF THE INVENTION

A first aspect of the invention provides an electromagnetic interference (EMI) shield for location in an aperture in a wall of a system unit housing. The electromagnetic interference shield is integrally formed from sheet metal. It comprises a perforated substantially planar portion (or plate) with fingers defined around the periphery thereof. A plurality of first fingers are preformed to define abutments to abut against an outer surface of the wall and a plurality of second fingers are preformed to sprung latches for latching within the aperture.

The combination of first and second fingers means that the EMI shield can be located in the aperture in a removable manner without the use of tools. The perforations in the planar portion are configured to permit ventilation of the interior system housing while preventing EMI interference radiating from the system housing. The substantially planar portion has approximately the same shape as the aperture to be filled and is slightly smaller than the aperture, a gap around the planar portion being occupied by the fingers.

In an embodiment of the invention, the first fingers alternate with the second fingers along at least one edge of the substantially planar portion. This provides for reliable location of the EMI shield in the aperture.

In one example, the first fingers comprise a first portion that extends substantially perpendicular to the substantially planar portion, a second portion that is folded back on the first portion and a third portion that extends away from and substantially parallel to the plane of the substantially planar portion. The second fingers comprise a springy portion that extends generally perpendicular but slightly outwardly with respect to the substantially planar portion and an angular latching portion at the end of the springy portion.

In an example of the invention the second fingers extend to the rear of the substantially planar portion, the electromagnetic interference shield further comprising a handle portion at the periphery of the substantially planar portion, the handle portion extending to the front of the substantially planar portion. This facilitates the insertion and removal of the shield. The EMI shield can be used for covering an aperture of a media drive bay.

The preferred embodiment of the EMI shield is stamped and folded from stainless steel.

Another aspect of the invention provides a system unit comprising a housing, an aperture in a wall of the housing providing access to a drive bay and an electromagnetic interference shield as set out above and located in the aperture.

A further aspect of the invention is a method of providing electromagnetic interference shielding for an aperture in a wall of a system unit housing, the method comprising removably locating in the aperture an electromagnetic interference shield that is integrally formed from sheet metal, the electromagnetic interference shield comprising a perforated substantially planar portion with fingers defined around the periphery thereof, a plurality of first fingers being preformed to define abutments to abut against an outer surface of the wall and a plurality of second fingers being preformed to define sprung latches for latching within the aperture.

Further aspects and advantages of the invention will become apparent from the following description of a particular embodiment.

BRIEF DESCRIPTION OF THE DRAWINGS

Embodiments of the present invention will be described hereinafter, by way of example only, with reference to the accompanying drawings in which like reference signs relate to like elements and in which.

DESCRIPTION OF PARTICULAR EMBODIMENTS

Embodiments of the present invention are described in the following with reference to the accompanying drawings, by way of example only.

Figure 1:
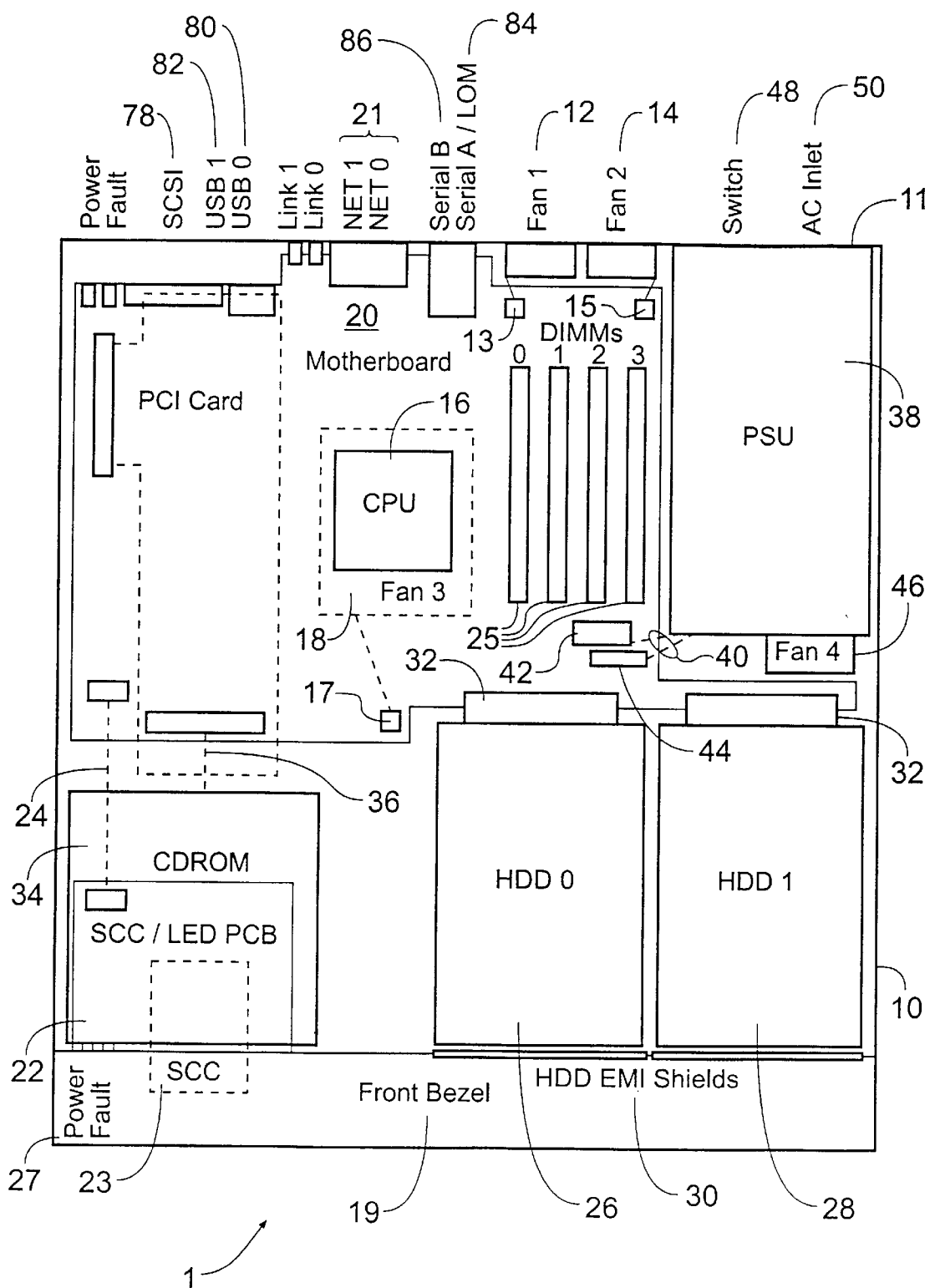
FIG. 1 is a physical plan view of a computer system that implements an embodiment of the invention.

FIG. 1 is a physical plan view of narrow form-factor computer system 1 designed for rack mounting. This computer system is compactly configured while offering high performance at reasonable cost.

The computer system 1 comprises a housing 10 with a front bezel 19 that is removable for front access to the disk drives and a System Configuration Card (SCC) 23 and reader 22. Rack mounting is supported for standard 19" racks via right-angled flanges (not shown). Slide-rail support is also provided.

The housing 10 is cooled, from front to rear, by two system fans 12, 14 mounted on a rear panel of the housing, with venting in the front and rear panels as required. The host processor (CPU) 16 also has its own dedicated local cooling comprising an impingement fan 18 that clips onto the CPU socket. These three fans plug directly into the motherboard 20 at 13, 15 and 17, respectively. The motherboard 20 is a PCB assembly, designed in a custom form-factor to fit the housing 10. The shape of the motherboard is chosen so as to minimise cabling within the housing. The motherboard 20 carries the majority of circuitry within the computer system 1.

All external interfaces are included directly on the rear edge of the motherboard, for access through the rear-panel 11 of the housing 10. The external interfaces comprise two network interfaces 21, two serial interfaces 84, 86 and a Small Computer System Interface (SCSI) interface 78. Indicators for Power, Fault and Network Link status are also positioned at the rear of the enclosure.

A system, or host, processor (CPU) 16 for the computer system 1 is mounted in a standard 370 pin zero insertion force (ZIF) socket on the motherboard 20. It has a passive heat sink. Dual in-line memory modules (DIMMs) are mounted in sockets 25 on the motherboard 20. A small printed circuit board (PCB) 22 is included at the front of the enclosure 10 to carry a System Configuration Card (SCC) 23 and LEDs 27 for Power and Fault status indication. A 10-way ribbon cable 24 connects this PCB to the motherboard 20. Two SCSI hard disk drives 26 and 28 are mountable in respective bays to the front of the motherboard 20. The drives are hot pluggable and are accessible by removal of the front bezel 19 and EMI shields 30. The two internal SCSI hard disk drives 26 and 28 plug directly into the motherboard via right-angled connectors 32 located on the front edge of the motherboard 20.

A slim (notebook-style) CDROM drive bay is provided, mounted laterally in front of the motherboard for a CDROM drive 34. Compact disks may be inserted and removed via an access slot (not shown) located on the lower left side of the front bezel 19. A connector at the rear of the CDROM bay connects the CDROM drive 34 via a ribbon cable 36 to the motherboard 20.

A Power Supply Unit (PSU) 38 is connected to the motherboard via a short harness 40 with two mating connectors 42 and 44 for power and services. The PSU 38 has its own cooling fan 46 and additionally houses the system power switch 48 and power input connector(s) 50.

FIG. 1 is a perspective view of a first electromagnetic interference shield 200 which is aligned adjacent an aperture 204 in the front wall 202 of the computer system housing 10 of FIG. 1. The aperture 204 provides an aperture to a drive bay for a hard disk drive 28. The edge of the aperture 204 is formed by folding back portions of the front wall 202 to form a flange 208. The flange 208 is located above and below the aperture 204 but not to the left and right thereof.

Figure 2:
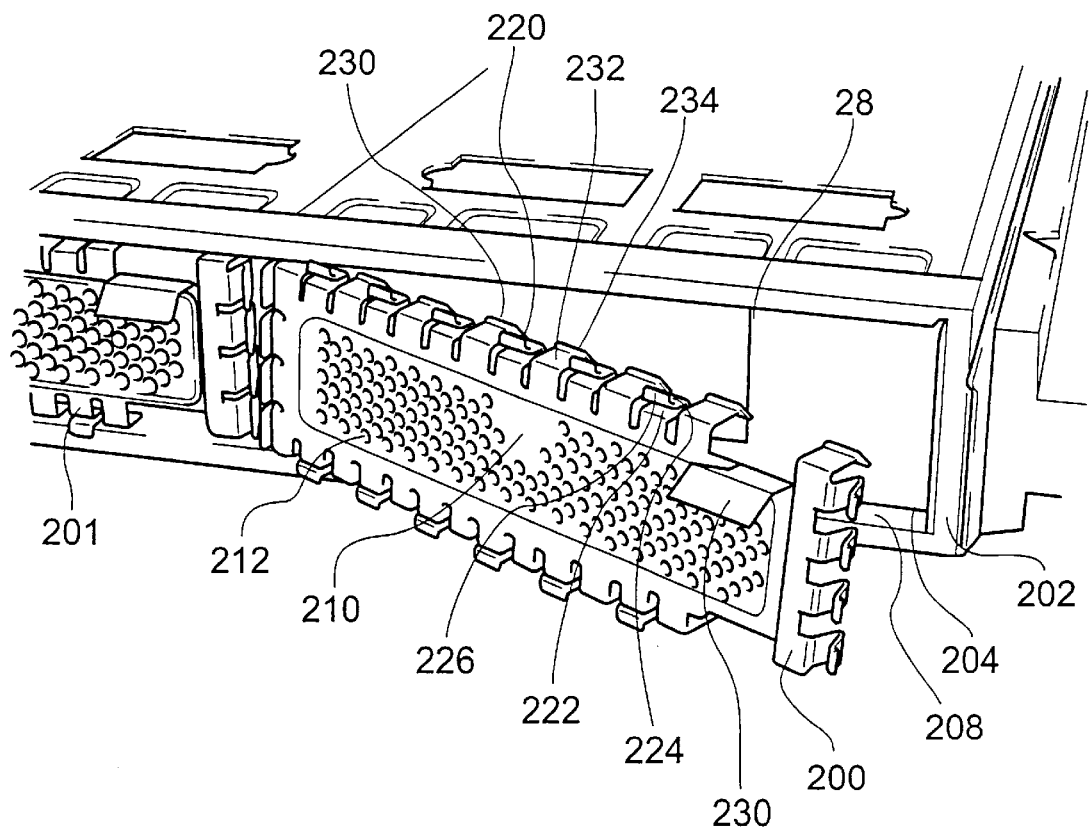
FIG. 2 is a perspective representation of an electromagnetic interference shield according to an embodiment of the invention.

The electromagnetic interference (EMI) shield 200 is formed by stamping and folding processes from a sheet of metal, for example from stainless steel of, for example, 0.8 mm thickness. The electromagnetic interference shield 200 comprises a central generally planar portion or plate 210 which is formed with a plurality of ventilation holes, or perforations, 212. The perforations in the electromagnetic interference shield enable ventilation of the interior of the housing 10 while still preventing electromagnetic interference from leaking to the outside of the housing 10 when the EMI shield is in place in the aperture 204. Around the periphery of the planar portion 210, a plurality of fingers 220 and 230 are formed. The fingers fall into two basic categories. A first category of finger 220 is folded back on itself to form a detent that latches on the outside of the wall 202 when the EMI shield 200 is placed in the aperture 204. The shape of the first form of finger is also shown in the side view of such a finger 220 in FIG. 3. Thus, a first finger type 220 comprises a first portion 222 that extends substantially perpendicular to the planar portion 210 towards the interior of the aperture 204 as shown in FIG. 2. The first finger is then bent back on itself to form a second portion 224 which then terminates in a further portion 226 which is substantially parallel to the planar portion 210. The construction of the first finger 220 is that, when the EMI shield is inserted into the aperture 204, the portion 226 of the finger 220 acts as a detent or abutment that abuts against the front surface 202 of the housing 10, preventing the EMI shield from falling into the aperture 204.

Figures 3, 4:
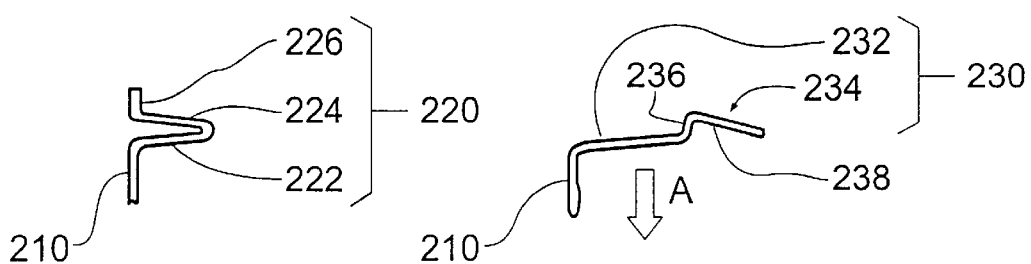
FIG. 3 illustrates a first form of finger provided on the electromagnetic interference shield of FIG. 2.
FIG. 4 illustrates a second form of finger provided on the electromagnetic interference shield of FIG. 2.

A second form of finger 230 is illustrated in more detail in FIG. 4. It can be seen that the second form of finger includes a first portion 232 which extends towards the aperture and substantially perpendicular to the planar portion 210. The first portion 232 acts as a spring portion that terminates in an angular latching portion 234 which includes a step 236 at the end of the springy portion 232 followed by a ramp 238 at an angle to that of the springy portion 232. Thus, in use, as the EMI shield 200 is inserted into the aperture 204, the edge of the aperture rides on the outer surface of the ramp portion 238 causing the springy portion 232 to move inwardly (ie, downwardly as represented by the arrow A in FIG. 4) until the step portion 236 latches behind the rear edge of the flange 208. The length of the springy portion 232 is chosen such that the step portion 236 is distanced from the detent 226 of the first finger type 220 by the depth of the flange 208. Thus, when the step portion 236 latches behind the rear edge of the flange 208, the detent 226 is abutting against the front surface of the wall 202, providing a firm location of the EMI shield 200. The left hand side of FIG. 2 shows a second EMI shield 201 located in a further aperture.

It will be noted that, along the upper and lower edges of the EMI shield 200 as shown in FIG. 2 (that is the longer edges of the planar portion 210), the first and second finger types 220 and 230 alternate with each other. At the left and right hand ends of the EMI shield 200, only fingers of the first type are provided, as the ends of the apertures do not have flanges corresponding to the flange 208. Accordingly, it is merely necessary at the ends to ensure that the ends do not disappear within the aperture 208. As also illustrated in FIG. 2, the provision of the fingers of the first type at an end of the planar portion 210 allow a pivoting action to be employed to facilitate the insertion of the EMI shield 200.

To further facilitate the insertion and removal of the EMI shield, a handle portion 230 is formed which extends from the planar portion 210 of the EMI shield in a direction substantially opposite to that of the first and second finger types. In other words, one could describe the first and second finger types as extending rearwardly from the planar portion 210 of the EMI shield 200, whereas one could describe the handle 230 as extending forwardly with respect to that planar portion 210.

It will be appreciated that the EMI shield as shown in FIG. 2 provides a single component that can be inserted in and removed from an aperture in the housing in a reliable manner without the use of tools. The EMI shield 200 provides the required EMI shielding while still enabling ventilation of the interior of the housing thanks to the perforations in the planar portion 210 of the EMI shield 200.

Although a particular embodiment of the invention has been described, it will be appreciated that the invention is not limited thereto and that many modifications, including additions, deletions and substitutions may be made within the spirit and scope of the claimed invention.

What is claimed is:

1. An electromagnetic interference shield for location in an aperture in a wall of a system unit housing, the electromagnetic interference shield being integrally formed from sheet metal and comprising:

a perforated substantially planar portion with fingers defined around the periphery thereof, a plurality of first fingers being preformed to define abutments to abut against an outer surface of the wall and a plurality of second fingers being preformed to define sprung latches for latching within the aperture, and a handle portion at the periphery of the substantially planar portion.

2. The electromagnetic interference shield of claim 1, wherein the substantial planar portion has approximately the same shape as the opening to be filled.

3. The electromagnetic interference shield of claim 1, wherein the first fingers alternate with the second fingers around at least part of the periphery of the substantially planar portion.

4. The electromagnetic interference shield of claim 1, wherein each of the first fingers comprises a first portion that extends substantially perpendicularly to the substantially planar portion, a second portion that is folded back on the first portion and a third portion that extends away from and substantially parallel to the plane of the substantially planar portion.

5. The electromagnetic interference shield of claim 1, wherein each of the second fingers comprises a springy portion that extends generally perpendicular but slightly outwardly with respect to the substantially planar portion and an angular latching portion at the end of the springy portion.

6. The electromagnetic interference shield of claim 1, wherein the second fingers extend to the rear of the substantially planar portion and the handle portion extends to the front of the substantially planar portion.

7. The electromagnetic interference shield of claim 1, wherein the shield is configured to be located in an aperture of a media drive bay.

8. The electromagnetic interference shield of claim 1, wherein the metal is stainless steel.

9. A system unit comprising a housing, an aperture in a wall of the housing providing access to a drive bay and an electromagnetic interference shield located in the aperture, the electromagnetic interference shield being integrally formed from sheet metal and comprising:
 a perforated substantially planar portion with fingers defined around the periphery thereof, a plurality of first fingers being preformed to define abutments to abut against an outer surface of the wall and a plurality of second fingers being preformed to define sprung latches for latching within the aperture, and
 a handle portion at the periphery of the substantially planar portion.

10. The system unit of claim 9, wherein the substantial planar portion has approximately the same shape as the opening to be filled.

11. The system unit of claim 9, wherein the first fingers alternate with the second fingers around at least part of the periphery of the substantially planar portion.

12. The system unit of claim 9, wherein each of the first fingers comprises a first portion that extends substantially perpendicularly to the substantially planar portion, a second portion that is folded back on the first portion and a third portion that extends away from and substantially parallel to the plane of the substantially planar portion.

13. The system unit of claim 9, wherein each of the second fingers comprises a springy portion that extends generally perpendicular but slightly outwardly with respect to the substantially planar portion and an angular latching portion at the end of the springy portion.

14. The system unit of claim 9, wherein the second fingers extend to the rear of the substantially planar portion and the handle portion extends to the front of the substantially planar portion.

15. The system unit of claim 9, wherein the shield is configured to be located in an aperture of a media drive bay.

16. The system unit of claim 9, wherein the metal is stainless steel.

17. A computer system comprising a housing, an aperture in a wall of the housing providing access to a drive bay and an electromagnetic interference shield located in the aperture, the electromagnetic interference shield comprising:
 a perforated substantially planar portion with fingers defined around the periphery thereof, a plurality of first fingers being preformed to define abutments to abut against an outer surface of the wall and a plurality of second fingers being preformed to define sprung latches for latching within the aperture, and
 a handle portion at the periphery of the substantially planar portion.

18. A method of providing electromagnetic interference shielding for an aperture in a wall of a system unit housing, the method comprising removably locating in the aperture an electromagnetic interference shield that is integrally formed from sheet metal, the electromagnetic interference shield comprising:
 a perforated substantially planar portion with fingers defined around the periphery thereof, a plurality of first fingers being preformed to define abutments to abut against an outer surface of the wall and a plurality of second fingers being preformed to define sprung latches for latching within the aperture, and
 a handle portion at the periphery of the substantially planar portion.

19. An electromagnetic interference shield for location in an aperture in a wall of a system unit housing, the electromagnetic interference shield being integrally formed from sheet metal and comprising:
 a perforated substantially planar portion with finger means defined around the periphery thereof, a plurality of first finger means being preformed to define abutments to abut against an outer surface of the wall and a plurality of second finger means being preformed to define sprung latches for latching within the aperture, and
 handle means at the periphery of the substantially planar portion.

* * * * *